United States Patent [19]

Hidber et al.

[11] Patent Number: 5,543,008
[45] Date of Patent: Aug. 6, 1996

[54] METHOD OF MANUFACTURE OF A PROTECTIVE COATING ON AN ELECTRONIC ASSEMBLY

[75] Inventors: Arthur Hidber, Esslingen; Eduard Ryser, Uster, both of Switzerland

[73] Assignee: Cerberus AG, Switzerland

[21] Appl. No.: 85,642

[22] Filed: Jun. 30, 1993

[30] Foreign Application Priority Data

Jun. 30, 1992 [CH] Switzerland ............... 2044/92

[51] Int. Cl.$^6$ .............. B32B 31/20; B32B 31/04
[52] U.S. Cl. ............... 156/229; 156/242; 156/244.18; 156/252; 156/256; 156/308.2; 156/309.9; 427/96; 428/901
[58] Field of Search ............ 428/901; 257/787, 257/788; 156/256, 229, 242, 261, 244.18, 252, 308.2, 309.9; 427/96; 264/288.4

[56] References Cited

U.S. PATENT DOCUMENTS

| | | | |
|---|---|---|---|
| 2,772,501 | 12/1956 | Malcolm | 41/37 |
| 2,938,939 | 5/1960 | Malcolm | 147/68.5 |
| 3,713,939 | 1/1973 | Preg | 156/268 X |
| 3,816,886 | 6/1974 | Van Cappellen | 264/288.4 X |
| 3,996,328 | 12/1976 | Coffin et al. | 264/280 |
| 4,687,615 | 8/1987 | Kondo et al. | 264/289.3 X |
| 4,822,836 | 4/1989 | Wroczynski | 524/287 X |
| 4,922,775 | 5/1990 | Winter | 83/333 |
| 5,001,195 | 3/1991 | van Groep | 525/229 X |
| 5,018,670 | 5/1991 | Chalmers | 239/433 |
| 5,102,712 | 4/1992 | Pierce et al. | 428/901 X |
| 5,114,518 | 5/1992 | Hoffarth et al. | 156/307.7 X |
| 5,158,324 | 10/1992 | Flesher | 296/136 X |
| 5,168,787 | 12/1992 | Blaimschein | 83/465 |
| 5,173,239 | 12/1992 | Gunter, Jr. et al. | 264/288.4 |
| 5,229,192 | 7/1993 | Kober et al. | 428/901 X |
| 5,260,130 | 11/1993 | Sakaguchi et al. | 428/901 X |
| 5,318,855 | 6/1994 | Glovatsky et al. | 428/901 X |

FOREIGN PATENT DOCUMENTS

| | | |
|---|---|---|
| 0329172 | 8/1989 | European Pat. Off. . |
| 1182319 | 11/1964 | Germany . |
| 60-209884 | 10/1985 | Japan . |
| 1186316 | 7/1989 | Japan . |

Primary Examiner—David A. Simmons
Assistant Examiner—M. Curtis Mayes
Attorney, Agent, or Firm—Brumbaugh, Graves, Donohue & Raymond

[57] ABSTRACT

A protective coating for an electronic assembly on a circuit board is made from a pre-fabricated, roll-flattened plastic ribbon having desired pre-determined thickness. From the ribbon, a suitably shaped membrane piece is produced, e.g., by stamping or by water-jet cutting, with openings as may be desired for circuit components to be left uncovered. The membrane is placed onto the circuit board, softened by heating, and pressed on by means of a silicone stamp, for close contact with electronic modules to be protected. The membrane is then adhered to the circuit board by further heating. The starting material for the membrane is a mixture of a thermoplastic material and of a wax including a significant amount of branched-chain and cycloaliphatic hydrocarbons.

11 Claims, 2 Drawing Sheets

METHOD OF MANUFACTURE OF A PROTECTIVE COATING ON AN ELECTRONIC ASSEMBLY

BACKGROUND OF THE INVENTION

The invention relates to protective coatings for electronic assemblies on a circuit board, and to methods for their manufacture.

Protective coatings for electronic assemblies are described, e.g., by James J. Licari, "Plastic Coatings for Electronics", McGraw-Hill Book Company, New York. Such coatings serve to protect electronic modules on circuit boards against ambient factors such as humidity and contamination which may lead to corrosion of circuit elements, to attendant changes in circuit characteristics, and to diminished isolation resistance between conductor paths of a printed circuit or between the contacts of circuit elements.

Known protective coatings are typically applied by dipping, casting, varnishing, spraying or painting with a suitable plastic material or an artificial resin. Disadvantageously, such applications are slow to dry and harden. Also, they are difficult to apply uniformly especially over sharp edges and points, and may require repeated application and inversion of the circuit board during drying. Complicated dosage control devices are required whose maintenance is costly and which require frequent cleaning, localized application leaving certain components uncovered is difficult, and resulting coatings typically have pores and are not sufficiently and uniformly dense.

According to Japanese Patent Document JP-A- 60,209, 884 in the name of Toshiba KK (see Patent Abstracts of Japan, Vol. 10, No. 72), the reliability of electrical connections in printed circuits on circuit boards is improved upon application of thermoplastic layers on front- and back-sides of a circuit board, e.g., layers of polyvinylchloride or the like, followed by melting to adhere the layers in forming integrated-circuit cards. Disadvantageously, circuits covered by this method are no longer accessible, i.e., a resulting integrated-circuit card does not permit access to circuit components for carrying out measurements, and circuit modules can no longer be replaced.

SUMMARY OF THE INVENTION

Disposed, on at least a portion of a surface of an electronic circuit-board assembly to be protected against ambient air and humidity, is a surface-conforming protective coating allowing for through-contact and for solder connection, the protective coating consisting essentially of an electrically insulating membrane material comprising a thermoplastic material and a wax additive for improved flow characteristics at thermoplastic flow temperatures. A preferred method for producing the protective coating involves shaping an electrically insulating membrane to a desired shape, placing the shaped electrically insulating membrane on the circuit-board assembly, and adhering the placed electrically insulating membrane to the circuit-board assembly by heating.

Protective coatings as preferred in accordance with the invention are readily applied, using simple processing means which require little maintenance. Substantially uniform layer thickness can be realized, as well as impermeability to air and humidity, while selected component regions can be left uncovered. Advantageously, during the entire life span of a circuit board, preferred protective coatings permit access to selected circuit elements for carrying out measurements and for replacement of components even after application of a coating. The application of preferred protective coatings can be automated, for rapid, low-cost assembly-line processing. Advantageously in preferred processing, the amount of coating material left-overs is minimized, as remnants can be recycled.

DETAILED DESCRIPTION OF PREFERRED EMBODIMENTS

Figure 1:
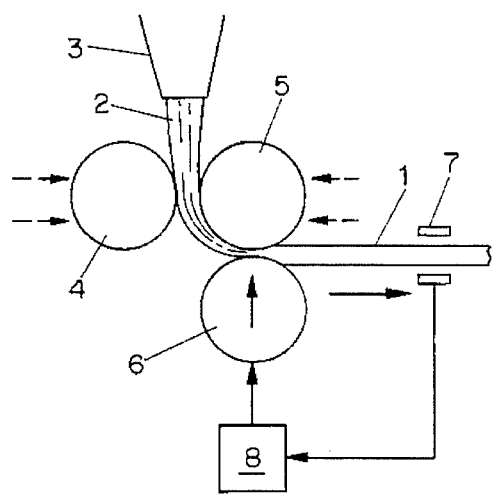
FIGS. 1–6 are schematics which illustrate processing steps in an exemplary method in accordance with the invention.

Shown in the Drawing are a ribbon 1 made from starting material 2 using an extruder 3 with cooled rolls 4 and 5, a pressure roll 6, a thickness gauge device 7 and a thickness control device 8. A stamp cutter 11 is shown for cutting a protective membrane 16 for a circuit board 9 with electronic modules 13. Openings 10 are for components 14 to remain uncovered. Shown further are remnants 12, infrared radiation heater 15, and a soft-silicone stamp 17.

In a preferred embodiment, the coating material consists essentially of a mixture of a first component comprising polypropylene, a hydrocarbon resin, styrol-butadiene polymer, paraffin wax and polyethylene, and a second component of a wax comprising a significant amount of branched-chain and cycloaliphatic hydrocarbons. Preferably, the thermoplastic material includes the two components with a ratio by weight in the range from 9:1 to 3:7. Particularly preferred is a mixture of approximately 7 parts by weight of the first component and 3 parts by weight of the second component.

Preferred further is a protective coating membrane with openings for access to selected components on the circuit board, with the coating material having a melting temperature in the range from 120° to 170° C.

Preferred manufacture of a plastic membrane involves a preliminary step of casting a molten starting material onto a suitable surface, or of casting followed by stretching between parallel rolls, to produce a ribbon, strip or tape out of which a desired plastic membrane is cut. Particularly preferred is cutting by water jet.

Further preferred, after positioning of the plastic membrane on the circuit board, is softening of the membrane by heating, and pressing of the softened membrane onto the electronic assembly by means of a silicone stamp, for surface conformance and to eliminate air pockets. In a final processing step, the protective coating is adhered to the circuit board by further heating.

Figure 2:
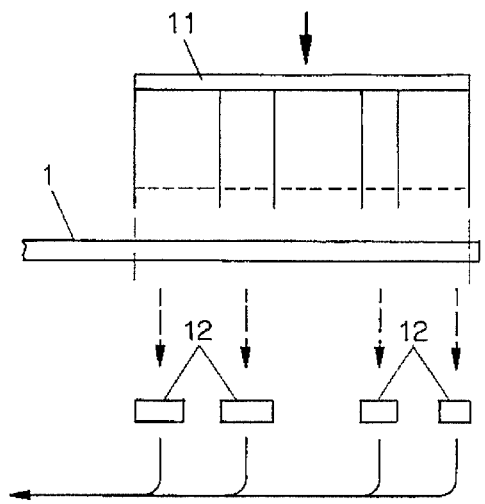
Figure 3:
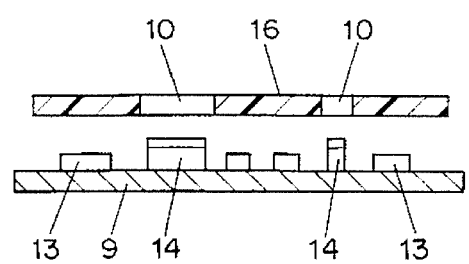
Figure 4:
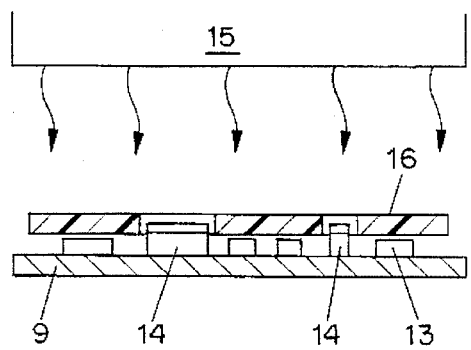
Figure 5:
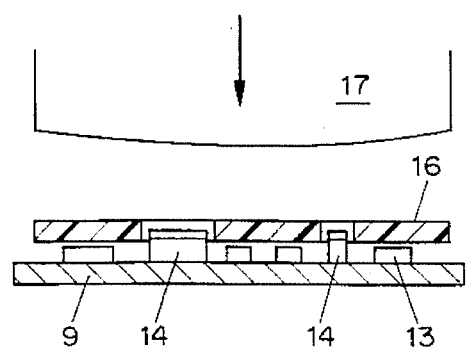
Figure 6:
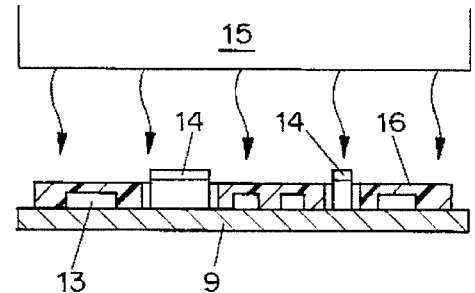
Figure 7:
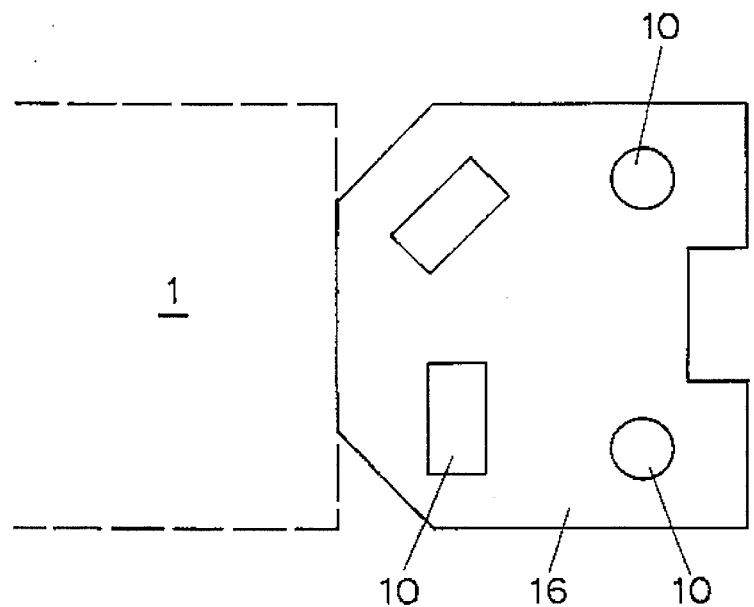
FIG. 7 is a top view of an electrically insulating shaped membrane exemplifying an aspect of the invention.
Figure 8:
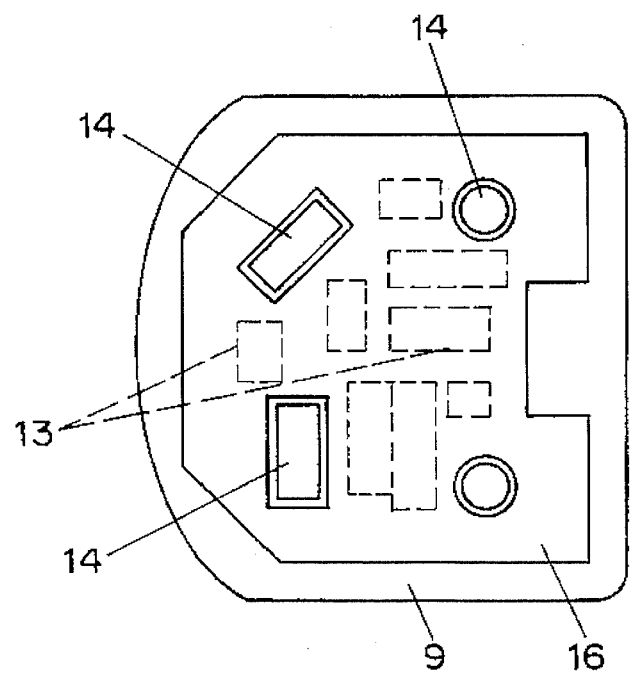
FIG. 8 is a top view of an electronic assembly including a circuit board, with a protective coating in accordance with an aspect of the invention.

Preferred processing as illustrated by FIG. 1–6 involves a step (FIG. 1) of making a ribbon from a suitable starting material. Preferred is a mixture of a first component comprising polypropylene, a hydrocarbon resin, styrol-butadiene polymer, paraffin wax and polypropylene as commercially available from the 3M company under the designation Jet-Melt 3748, and of a second component which enhances the flow characteristics and which consists of a wax with a significant content of branched-chain and cycloaliphatic hydrocarbons. For example, such a wax can be obtained under the designation Lunarit 3286 from the firm H. B. Fuller, Lüneburg, Germany.

For the preparation of the starting material, the components are mixed in suitable proportion depending on intended use. Particularly suitable is a material with a softening temperature greater than 100° C. or with a melting temperature in the range from 120° to 170° C., and which, upon hardening on the circuit board, forms a pore-free coating impermeable to air and humidity. A preferred material is resistant to detrimental ambient influence and to contamination, it has sufficiently constant characteristics at different temperatures, and it is sufficiently resistant to aging. Also, such a material is compatible with the components being coated and does not unduly influence their properties. A preferred exemplary material is obtained by mixing 70 kg Jet-Melt 3748 and 30 kg Lunarit 3286.

In a standard heatable mixer, the components of the starting material are mixed and heated to processing temperature. The molten material 2 flows from an extruder 3 into the gap between the rollers 4 and 5 which are cooled to the hardening temperature of the plastic material. The resulting solidified ribbon 1 remains formable, and its thickness is reduced to the desired membrane thickness by a pressure roll 6. The rolls may be protected by silicone paper. Thickness can be measured with the thickness gauge 7, and can be controlled with a control device 8 for keeping constant the pressure applied by the pressure roll 6. Upon leaving the pressure roll 6, the ribbon cools down and is ready for further processing into a protective membrane 16.

Instead of from a ribbon, a membrane can also be formed individually and repeatedly, e.g., by cooling and pressing a suitable amount of molten starting material to a desired thickness, or by casting onto a suitable surface. Continuous casting is not precluded, with the material supply and the movement of the surface adjusted for a desired membrane thickness.

The membrane thickness is chosen such that surface irregularities on the circuit board, especially solder points, are safely covered, and such that the membrane will not tear upon adhering by heating. Typically for this purpose, membrane thickness is approximately from 0.2 to 1 millimeter. For certain special applications, e.g., for the protection of circuit boards with protruding components or sharp points, thicker membranes may be used, e.g., membranes several millimeters thick.

The ribbon can be wound on a roll and kept for further processing, or it can be used immediately, step-wise with desired timing, for making desired individual, shaped membranes (FIG. 2) for circuit boards to be protected. This may be by cutting or stamping of the outer edge and of any openings 10 for components which are to remain uncovered. The stamping device 11 may operate repetitively, and it may have a stamp which can be replaced depending on the requirements of circuit boards. Stamping remnants 12 are readily remelted and recycled to the extruder 3, without disposal costs.

In the following step (FIG. 3), the shaped membrane 16 is placed on the circuit board 9 bearing circuitry and electronic components, thereby covering modules 13 while leaving other modules 14 free, as the latter protrude through the openings 10.

Then, in preferred optional steps, the placed membrane 16 is heated (FIG. 4) to a temperature above its softening point, without melting, and the softened membrane 16 is pressed (FIG. 5) onto the electronic components by means of a soft-silicone stamp 17. As a result, the membrane 16 comes into intimate contact with the components being covered, and air pockets are eliminated.

In a final processing step (FIG. 6), the coating 16 is adhered to the circuit board 9 by further heating. Conveniently, an infrared radiative heater 15 can be used for this purpose, placed over the membrane 16. Other heating means are not precluded, e.g., hot-air heating or heating with a hot, inert gas.

The coating thus formed on the circuit board 9 covers assemblies 13 to be protected, including their surface irregularities and points, with an air- and liquid-tight layer having uniform thickness, reliably protecting them against ambient influence. Partial openings, e.g., for switches, potentiometers, test points and the like are realized readily and without special measures.

Manufacture of the protective coating is readily automated with high repetition rate, for economical and cost-effective large-series production.

Modifications of the protective coating and of the method for its manufacture within the scope of the claims will be readily apparent to the person skilled in the art.

We claim:

1. A method for producing a protective coating on at least a portion of a surface of an electronic circuit-board assembly, comprising:

shaping to a desired shape an electrically insulating membrane of a material comprising a thermoplastic material and a wax additive for improved flow characteristics at thermoplastic flow temperatures, the wax additive being included in the membrane material in an amount of at least 10 weight percent;

placing the shaped electrically insulating membrane on the circuit-board assembly; and adhering the placed electrically insulating membrane to the circuit-board assembly, comprising heating.

2. The method of claim 1, wherein shaping is from a piece of an electrically insulating membrane ribbon.

3. The method of claim 2, wherein forming the electrically insulating membrane ribbon comprises casting of electrically insulating membrane material from a melt.

4. The method of claim 3, wherein forming the electrically insulating membrane ribbon further comprises stretching of cast electrically insulating membrane material between parallel rolls.

5. The method of claim 2, wherein forming the piece from the ribbon comprises stamping.

6. The method of claim 2, wherein forming the piece from the ribbon comprises water-jet cutting.

7. The method of claim 2, further comprising:

softening the placed electrically insulating membrane by heating, and pressing the softened membrane onto the electronic circuit-board assembly by means of a silicon stamp, for surface conformance of the membrane and to eliminate air pockets prior to adhering.

8. A method for producing a protective coating on at least a portion of a surface of an electronic circuit-board assembly, comprising:

preparing an electrically insulating membrane of a material comprising a thermoplastic material and a wax additive for improved flow characteristics at thermoplastic flow temperatures, allowing for openings for through-contact and/or solder connection;

the membrane material being a mixture of a first and a second component, the first component comprising polypropylene, a hydrocarbon resin, styrol-butadiene polymer, paraffin wax and polyethylene, and the second component consisting essentially of a wax comprising a significant amount of branched-chain and cycloaliphatic hydrocarbons;

shaping the electrically insulating membrane to a desired shape;

placing the shaped electrically insulating membrane on the circuit-board assembly; and adhering the placed electrically insulating membrane surface-conforming to the circuit-board assembly, comprising heating.

9. A method for producing a protective coating on at least a portion of a surface of an electronic circuit-board assembly, comprising:

shaping to a desired shape an electrically insulating membrane of a material comprising a thermoplastic material and a wax additive for improved flow characteristics at thermoplastic flow temperatures, allowing for openings for through-contact and/or solder connection;

placing the shaped electrically insulating membrane on the circuit-board assembly; and adhering the placed electrically insulating membrane surface-conforming to the circuit-board assembly, comprising heating;

wherein shaping is from a piece of an electrically insulating membrane ribbon;

further comprising forming the electrically insulating membrane ribbon, comprising casting of electrically insulating membrane material from a melt;

further comprising preparing the electrically insulating material, comprising mixing a first and a second component, the first component comprising polypropylene, a hydrocarbon resin, styrol-butadiene polymer, paraffin wax and polyethylene, and the second component consisting essentially of a wax comprising a significant amount of branched-chain and cycloaliphatic hydrocarbons.

10. The method of claim 9, wherein, in mixing, from 30 to 90 weight percent of the first component and a complementary amount of the second component are included.

11. The method of claim 10, wherein, in mixing, 70 weight percent of the first component and 30 weight percent of the second component are included.

\* \* \* \* \*

UNITED STATES PATENT AND TRADEMARK OFFICE
CERTIFICATE OF CORRECTION

PATENT NO. : 5,543,008
DATED : August 6, 1996
INVENTOR(S) : A. Hidber et al

It is certified that error appears in the above-indentified patent and that said Letters Patent is hereby corrected as shown below:

Col. 2, line 62, "polypropylene" should read --polyethylene--.

Signed and Sealed this

Nineteenth Day of August, 1997

Attest:

BRUCE LEHMAN

Attesting Officer

Commissioner of Patents and Trademarks